United States Patent
Wu et al.

(10) Patent No.: US 12,514,131 B2
(45) Date of Patent: Dec. 30, 2025

(54) METHOD FOR FABRICATING SEMICONDUCTOR DEVICE

(71) Applicant: UNITED MICROELECTRONICS CORP., Hsin-Chu (TW)

(72) Inventors: Jia-Rong Wu, Kaohsiung (TW); Rai-Min Huang, Taipei (TW); Ya-Huei Tsai, Tainan (TW); I-Fan Chang, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 224 days.

(21) Appl. No.: 18/098,091

(22) Filed: Jan. 17, 2023

(65) Prior Publication Data
US 2023/0157182 A1 May 18, 2023

Related U.S. Application Data

(62) Division of application No. 16/702,576, filed on Dec. 4, 2019, now abandoned.

(30) Foreign Application Priority Data
Nov. 15, 2019 (CN) .......................... 201911117619.X

(51) Int. Cl.
| | |
|---|---|
| *H10N 50/80* | (2023.01) |
| *H01F 10/32* | (2006.01) |
| *H01F 41/34* | (2006.01) |
| *H10B 61/00* | (2023.01) |
| *H10N 50/01* | (2023.01) |

(Continued)

(52) U.S. Cl.
CPC ......... *H10N 50/80* (2023.02); *H01F 10/3254* (2013.01); *H01F 41/34* (2013.01); *H10B 61/00* (2023.02); *H10N 50/01* (2023.02); *H10N 50/85* (2023.02); *G11C 11/161* (2013.01)

(58) Field of Classification Search
CPC ........ H10N 50/80; H10N 50/01; H10N 50/85; H10B 61/00
See application file for complete search history.

(56) References Cited

U.S. PATENT DOCUMENTS

| | | | |
|---|---|---|---|
| 9,040,405 B2 | 5/2015 | Hasche et al. | |
| 2005/0276090 A1 | 12/2005 | Yamagishi | |
| 2010/0078618 A1 | 4/2010 | Xiao | |

(Continued)

FOREIGN PATENT DOCUMENTS

| | | |
|---|---|---|
| CN | 106601904 A | 4/2017 |
| CN | 106847676 | 6/2017 |

(Continued)

OTHER PUBLICATIONS

Merriam-Webster OnLine Definition of "While." No Date.*
Merriam-Webster OnLine Definition of "Reserve." No Date.*

*Primary Examiner* — Nathan W Ha
(74) *Attorney, Agent, or Firm* — Winston Hsu

(57) ABSTRACT

A method for fabricating semiconductor device includes the steps of: forming a magnetic tunneling junction (MTJ) stack on a substrate; forming a top electrode on the MTJ stack; performing a first patterning process to remove the MTJ stack along a first direction; and performing a second patterning process to remove the MTJ stack along a second direction to form MTJs on the substrate.

2 Claims, 6 Drawing Sheets

(51) Int. Cl.
*H10N 50/85* (2023.01)
*G11C 11/16* (2006.01)

(56) References Cited

U.S. PATENT DOCUMENTS

| | | |
|---|---|---|
| 2011/0233696 A1 | 9/2011 | Li |
| 2013/0244344 A1 | 9/2013 | Malmhall |
| 2016/0308117 A1 | 10/2016 | Sandhu |
| 2019/0067566 A1* | 2/2019 | Nagel .................... H10N 50/80 |
| 2020/0075843 A1* | 3/2020 | Nagel .................... H10B 61/22 |
| 2021/0098530 A1* | 4/2021 | Manfrini ................ H10N 50/10 |
| 2021/0151664 A1 | 5/2021 | Wu |
| 2021/0217814 A1 | 7/2021 | Walker |
| 2023/0157182 A1* | 5/2023 | Wu ....................... H01F 41/308 |
| | | 257/421 |

FOREIGN PATENT DOCUMENTS

| | | |
|---|---|---|
| CN | 112820821 A | 5/2021 |
| JP | 2002-151660 A | 5/2002 |
| KR | 10-2017-0106554 A | 9/2017 |

\* cited by examiner

METHOD FOR FABRICATING SEMICONDUCTOR DEVICE

CROSS REFERENCE TO RELATED APPLICATIONS

This application is a division of U.S. application Ser. No. 16/702,576, filed on Dec. 4, 2019. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a magnetic tunneling junction (MTJ) stack on a substrate; forming a top electrode on the MTJ stack; performing a first patterning process to remove the MTJ stack along a first direction; and performing a second patterning process to remove the MTJ stack along a second direction to form MTJs on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
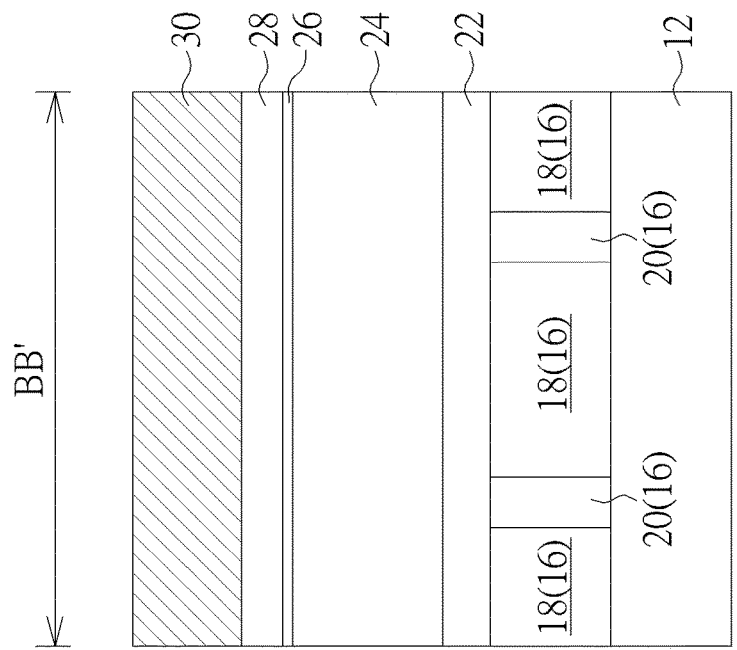
FIGS. 1-4 illustrate a method for fabricating a semiconductor device according to an embodiment of the present invention.
Figure 1:
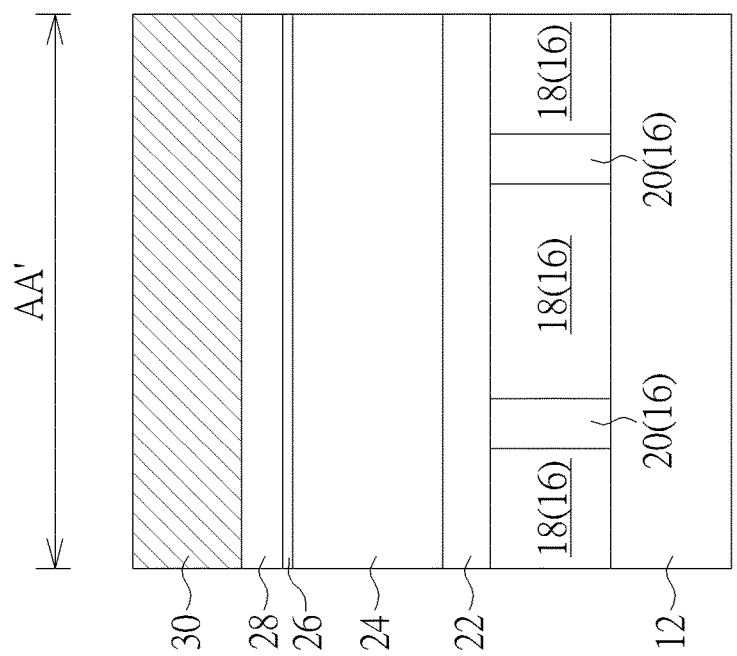
Figure 1:
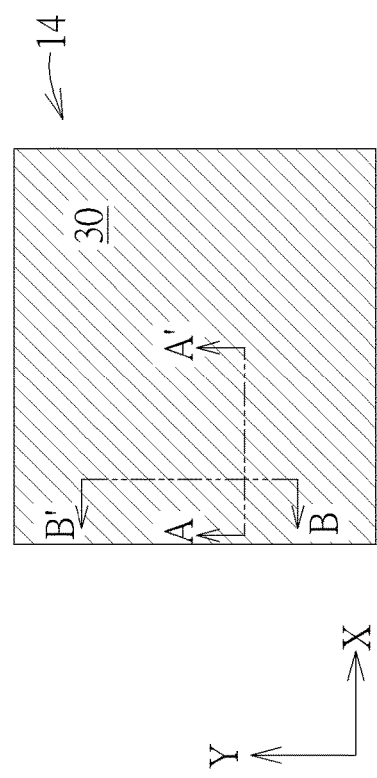

Referring to FIG. 1, FIG. 1 illustrates a method for fabricating a semiconductor device, or more specifically a MRAM device according to an embodiment of the present invention, in which the bottom portion of FIG. 1 illustrates a top view for fabricating the MRAM device, the top left portion of FIG. 1 illustrates a cross-section view for fabricating the MRAM device along the sectional line AA', and the top right portion of FIG. 1 illustrates a cross-section view for fabricating the MRAM device along the sectional line BB'. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer could be formed on the substrate 12 to cover the MOS transistors, and a plurality of contact plugs could be formed in the ILD layer to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structure 16 is formed on the ILD layer on the MTJ region 14 and the logic region to electrically connect the aforementioned contact plugs, in which the metal interconnect structure 16 includes an inter-metal dielectric (IMD) layer 18 and metal interconnections 20 embedded in the IMD layer 18. In this embodiment, each of the metal interconnections 20 from the metal interconnect structure 16 preferably includes a via conductor, and each of the metal interconnections 20 could be interconnected within the IMD layer 18 according to a single damascene process or dual damascene process. For instance, each of the metal interconnections 20 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the IMD layer 18 is preferably made of silicon oxide or ultra low-k (ULK) dielectric material and the metal interconnections 20 are preferably made of tungsten, but not limited thereto.

Next, a bottom electrode 22 is formed on the surface of the IMD layer 18, a MTJ stack 24 made of a pinned layer, a barrier layer, and a free layer are formed on the bottom electrode 22, and a top electrode 28 and a hard mask 30 are formed on the MTJ stack thereafter. It should be noted that since none of the above layers are patterned at this stage, the top view of the hard mask 30 shown on bottom portion of FIG. 1 is still un-patterned while the cross-section shown on the top left portion taken along the sectional line AA' and the cross-section shown on the top right portion taken along the sectional line BB' preferably share identical structures at this stage.

In this embodiment, the bottom electrode 22 and the top electrode 28 are preferably made of conductive material including but not limited to for example Ta, Pt, Cu, Au, Al, or combination thereof. The pinned layer could be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the stop layer 26 could be made of any material having etching selectivity with the top electrode 28 such as silicon oxide or silicon nitride and the hard mask 30 is preferably made of silicon nitride.

Figure 2:
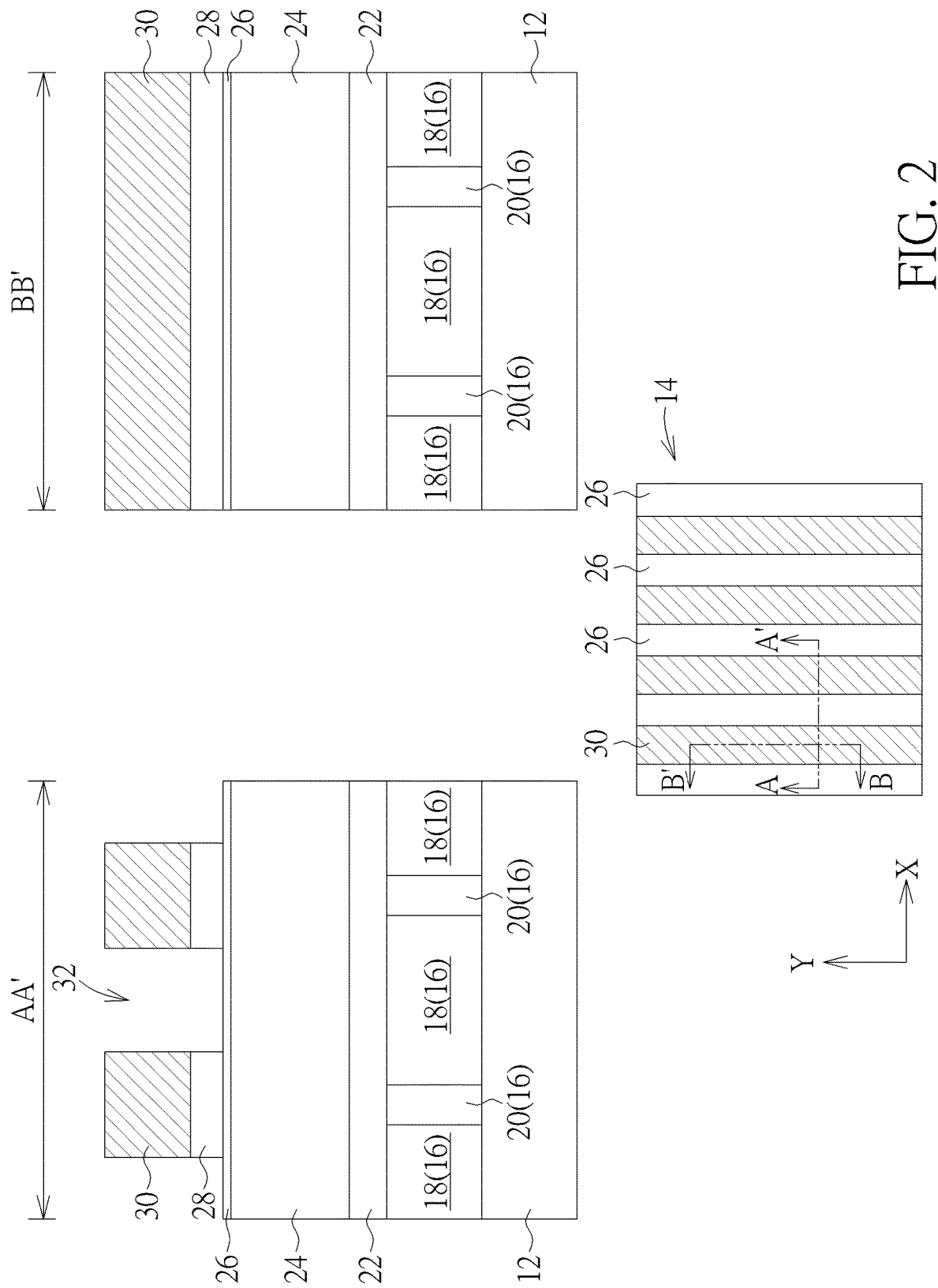

Next, as shown in FIG. 2, a first patterning process is conducted along a first direction (such as Y-direction) to remove part of the hard mask 30 and part of the top electrode 28 and stop on the stop layer 26. Specifically, the first patterning process conducted at this stage preferably involves using a patterned mask (not shown) such as a patterned resist as mask to remove part of the hard mask 30 and part of the top electrode 28 along the Y-direction to form a patterned hard mask 30, a patterned top electrode 28, and one or more recesses 32 between the patterned hard mask 30, as shown in the cross-section view taken along the sectional line AA' on top left portion of FIG. 2. As shown in the top view on the bottom portion of FIG. 2, the patterned hard mask 30 on the topmost level at this stage is preferably formed extending along the Y-direction in the shape of rectangular columns while the stop layer 26, the MTJ stack 24, and the bottom electrode 22 are not removed or still remained un-patterned at this stage.

Figure 3:
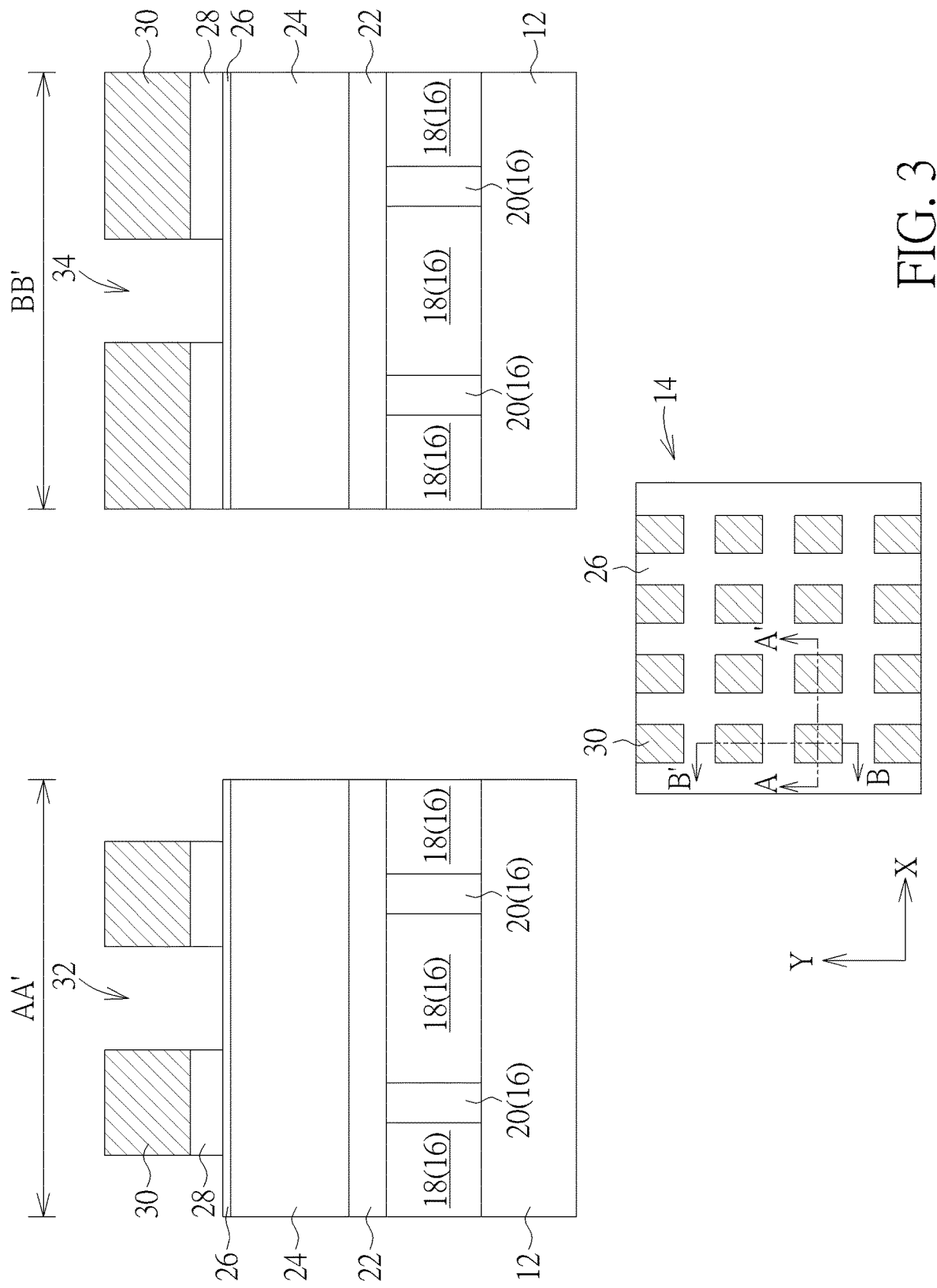

Next, as shown in FIG. 3, a second patterning process is conducted along a second direction (such as X-direction) orthogonal to the first direction to remove part of the hard mask 30 and part of the top electrode 28 once more and stop on the stop layer 26. Specifically, the second patterning process conducted at this stage preferably involves using another patterned mask (not shown) such as a patterned resist as mask to remove part of the hard mask 30 and part of the top electrode 28 along the X-direction with a first etching process for forming a re-patterned hard mask 30, a re-patterned top electrode 28, and recess or recesses 34 between the re-patterned hard mask 30, as shown in the cross-section view taken along the sectional line BB' on top right portion of FIG. 3. As shown in the top view on the bottom portion of FIG. 3, the re-patterned hard mask 30 on the topmost level at this stage is preferably transformed or altered from rectangular or columnar strips to a plurality of squares while the stop layer 26, the MTJ stack 24, and the bottom electrode 22 are still not removed and remained un-patterned at this stage.

Figure 4:
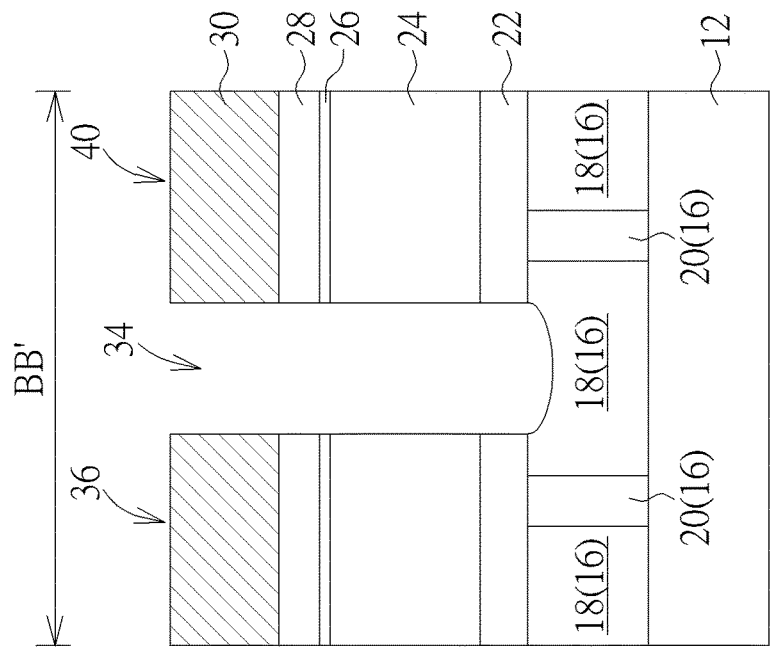
Figure 4:
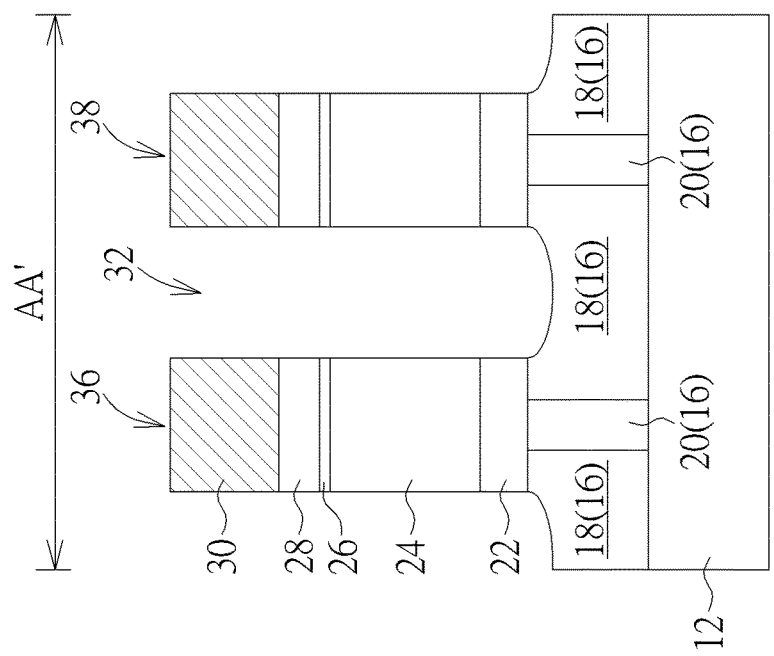
Figure 4:
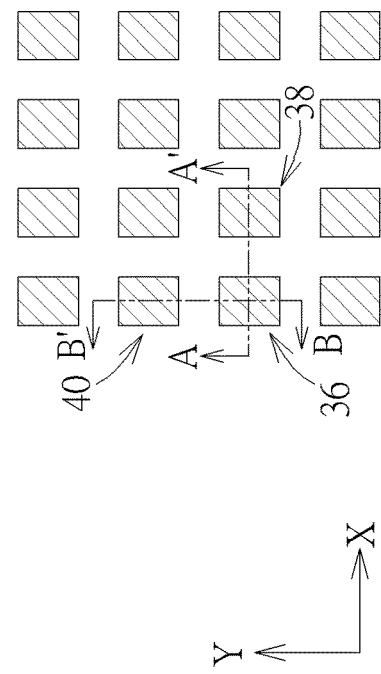

Next, as shown in FIG. 4, the second patterning process is continued by removing part of the remaining MTJ stack 24. Specifically, the remaining second patterning process conducted at this stage preferably involves carrying out a second etching process by directly using the patterned hard mask 30 as mask to remove the stop layer 26, MTJ stack 24, bottom electrode 22, and even part of the IMD layer 18 not covered by the hard mask 30 for forming a plurality of MTJs 36, 38, 40 on the substrate 12. Next, one or more IMD layers (not shown) could be formed on and surround the MTJs 36, 38, 40, and metal interconnections are formed in the IMD layers to electrically connect each of the top electrodes 28. This completes the fabrication of a semiconductor device according to an embodiment of the present invention.

Figure 5:
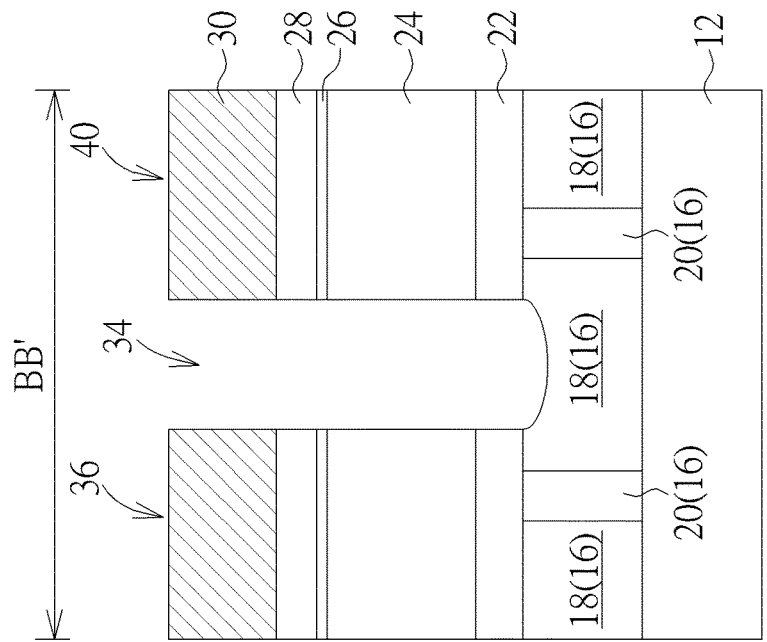
FIG. 5 illustrates a structural view of MTJs or top electrodes fabricated according to FIGS. 1-4 according to an embodiment of the present invention.
Figure 5:
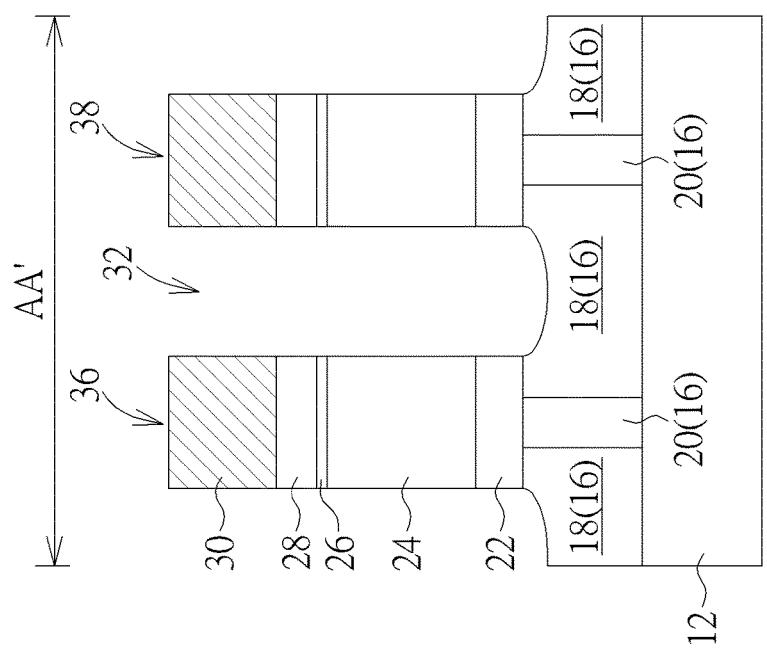
Figure 5:
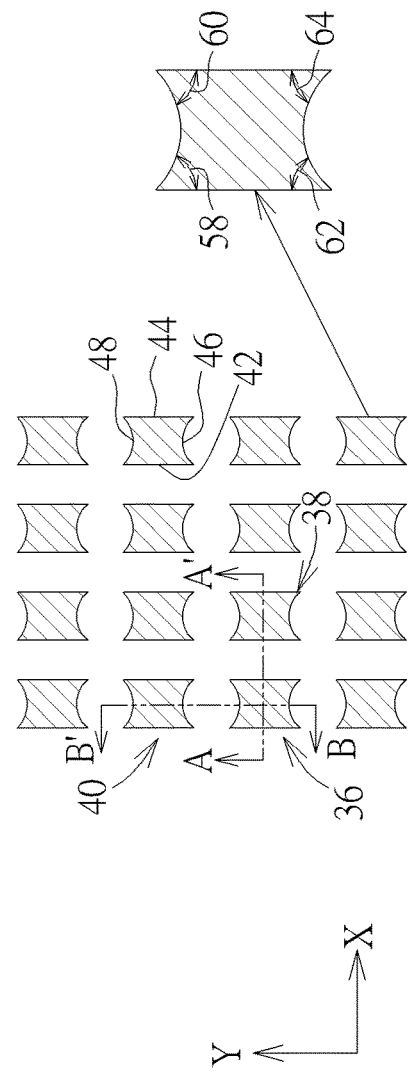

Referring to FIG. 5, the top portions of FIG. 5 illustrates structural views of the MTJs 36, 38, 40 fabricated according to FIGS. 1-4 according to an embodiment of the present invention and the bottom portion of FIG. 5 illustrates a top view of the MTJs 36, 38, 40 or top electrodes 28 of the semiconductor device. As shown in FIG. 5, the semiconductor device includes at least a MTJ such as MTJs 36, 38, 40 disposed on the substrate 12, an IMD layer 18 disposed on the substrate 12 to surround the MTJs 36, 38, 40, and a top electrode 28 disposed on each of the MTJs 36, 38, 40, in which a top view of each of the MTJs 36, 38, 40 or the top electrodes 28 includes at least one corner and the at least one corner is less than 90 degrees.

Viewing from a more detailed perspective, the top view of each of the top electrodes 28 could include a quadrilateral having four corners 58, 60, 62, 64, in which at least one corner 58 from the four corners could be less than 90 degrees, each of at least two corners 58, 60 could be less than 90 degrees, each of at least three corners 58, 60, 62 could be less than 90 degrees, or each of the four corners 58, 60, 62, 64 could be less than 90 degrees. Preferably, the quadrilateral includes a first side 42 and a second side 44 extending along a first direction such as Y-direction, a third side 46 connecting the first side 42 and the second side 44, and a fourth side 48 connecting the first side 42 and the second side 44, in which each of the third side 46 and the fourth side 48 includes a curve or more specifically a concave curve.

Figure 6:
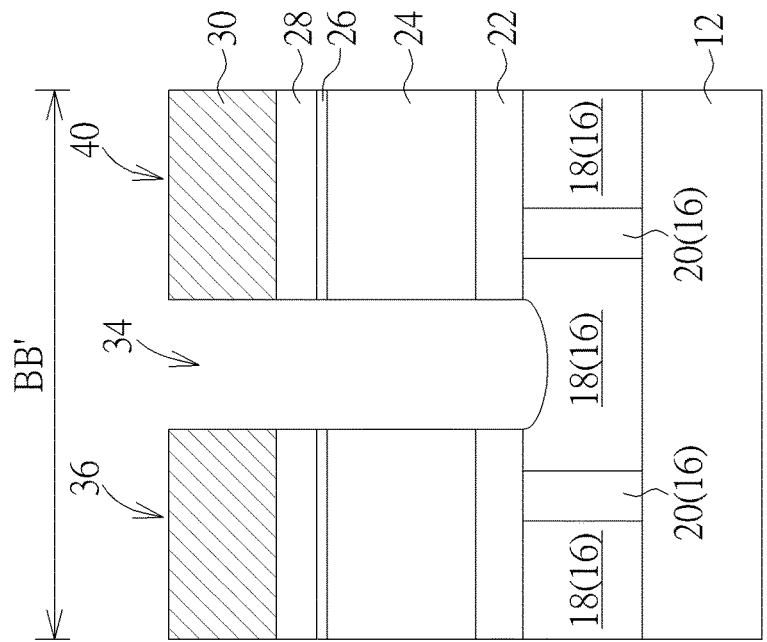
FIG. 6 illustrates a structural view of MTJs or top electrodes fabricated according to FIGS. 1-4 according to an embodiment of the present invention.
Figure 6:
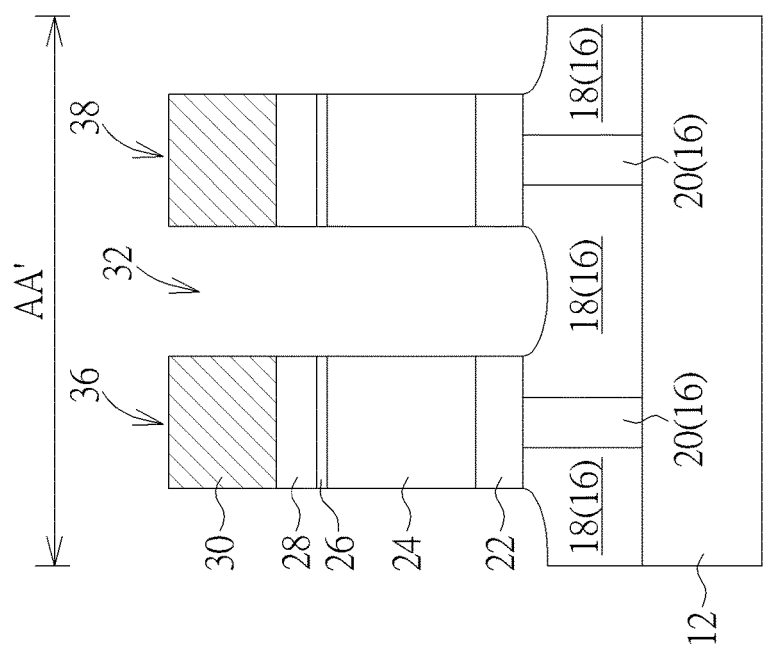
Figure 6:
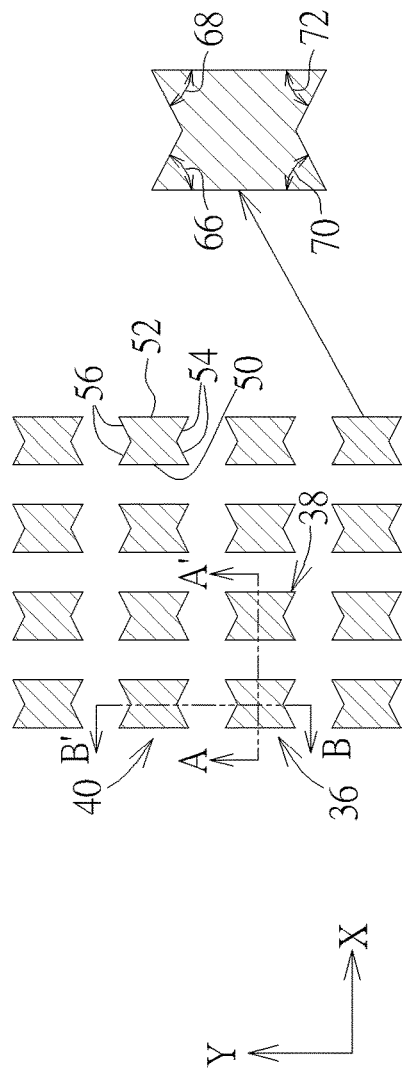

Referring to FIG. 6, the top portions of FIG. 6 illustrates structural views of the MTJs 36, 38, 40 fabricated according to FIGS. 1-4 according to an embodiment of the present invention and the bottom portion of FIG. 6 illustrates a top view of the MTJs 36, 38, 40 or top electrodes 28 of the semiconductor device. As shown in FIG. 6, the semiconductor device includes at least a MTJ such as MTJs 36, 38, 40 disposed on the substrate 12, an IMD layer 18 disposed on the substrate 12 to surround the MTJs 36, 38, 40, and a top electrode 28 disposed on each of the MTJs 36, 38, 40, in which a top view of each of the MTJs 36, 38, 40 or the top electrodes 28 includes at least one corner and the at least one corner is less than 90 degrees.

In this embodiment, the top view of each of the top electrodes 28 could include a hexagon having at least four corners 66, 68, 70, 72, in which at least one corner 66 from the four corners could be less than 90 degrees, each of at least two corners 66, 68 could be less than 90 degrees, each of at least three corners 66, 68, 70 could be less than 90 degrees, or each of the four corners 66, 68, 70, 72 could be less than 90 degrees. Preferably, the hexagon includes a first side 50 and a second side 52 extending along a first direction such as Y-direction, a third side 54 connecting the first side 50 and the second side 52, and a fourth side 56 connecting the first side 50 and the second side 52, in which each of the third side 54 and the fourth side 56 includes a V-shape.

Overall, the present invention preferably employs a double patterning and double etching (2P2E) approach to pattern the MTJ stack into a plurality of MTJs, in which the double patterning and double etching process could be accomplished by first conducting a first patterning process along a first direction to remove part of the top electrode, conducting a first stage etching process of the second patterning process along a second direction to remove part of the hard mask and part of the top electrode, and then conducting a second stage etching process of the second patterning process to remove part of the MTJ stack and part of the bottom electrode to form a plurality of MTJs. By using the aforementioned 2P2E approach to form the MTJs it would not only be desirable to obtain the top view outlines shown in FIGS. 5-6, but also obtain better control for critical dimension of the device as well as achieving better shrinkage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a bottom electrode on a substrate;
   forming a magnetic tunneling junction (MTJ) stack on the bottom electrode;
   forming a stop layer on the MTJ stack;
   forming a top electrode on the stop layer;
   forming a hard mask on the top electrode;
   performing a first patterning process to remove the hard mask and the top electrode along a first direction and stop on the stop layer;
   performing a first etching process to remove the hard mask and the top electrode along a second direction and stop on the stop layer; and
   performing a second etching process to remove the stop layer, the MTJ stack, and the bottom electrode to form MTJs on the substrate.

2. The method of claim 1, wherein the first direction is orthogonal to the second direction.

\* \* \* \* \*